US006806766B2

(12) United States Patent
Hasegawa (10) Patent No.: US 6,806,766 B2
(45) Date of Patent: Oct. 19, 2004

(54) BTL AMPLIFYING SYSTEM

(75) Inventor: Tatsuzo Hasegawa, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/368,487

(22) Filed: Feb. 20, 2003

(65) Prior Publication Data

US 2003/0160653 A1 Aug. 28, 2003

(30) Foreign Application Priority Data

Feb. 28, 2002 (JP) .................................... 2002-054034

(51) Int. Cl.$^7$ ............................. H03F 1/02; H03F 1/14

(52) U.S. Cl. ........................................... 330/9; 330/51

(58) Field of Search ............................. 330/9, 51, 69, 330/124 R (56) References Cited

U.S. PATENT DOCUMENTS 6,605,990 B2 * 8/2003 Vermeeren ..................... 330/9

* cited by examiner

Primary Examiner—Steven J. Mottola
(74) Attorney, Agent, or Firm—McGinn & Gibb, PLLC (57) ABSTRACT

A BTL amplifying system is provided to prevent a load, such as a speaker, from being damaged. While power amplifying circuits of the BTL configuration are driving a load, a differential voltage detecting unit, a low-pass filter, and a control unit together detect and judge the occurrence of an offset. Upon detection and judgment of the occurrence of an offset, a driving operation of the load is stopped by allowing the power amplifying circuits to stop their own amplifying operations or inhibiting a signal to be amplified from being inputted to the power amplifying circuits. Consequently, even when an offset occurs while the load is driven due to the influence of use environments or due to deterioration with time of an electronic element incorporated as one of the components, it is possible to forestall offset-induced adverse affects or damage to the load.

20 Claims, 8 Drawing Sheets

BTL AMPLIFYING SYSTEM

BACKGROUND OF THE INVENTION

The present invention relates to a BTL amplifying system for driving a load such as a speaker.

The present application claims priority from Japanese Application No. 2002-054034, the disclosure of which is incorporated herein by reference.

Conventionally, a BTL (Balanced Transformer Less) amplifier has been known as an amplifier for driving a load such as a speaker. The BTL amplifier is able to directly drive a load such as a speaker, and therefore, not only it excels in a frequency characteristic and a distortion characteristic, but also it offers an excellent advantage that a large output can be obtained on a low source voltage. For this reason, it has been used extensively in a portable audio device or in an audio device mounted on a vehicle, operating on a limited source voltage using a battery or the like.

Figure 8:
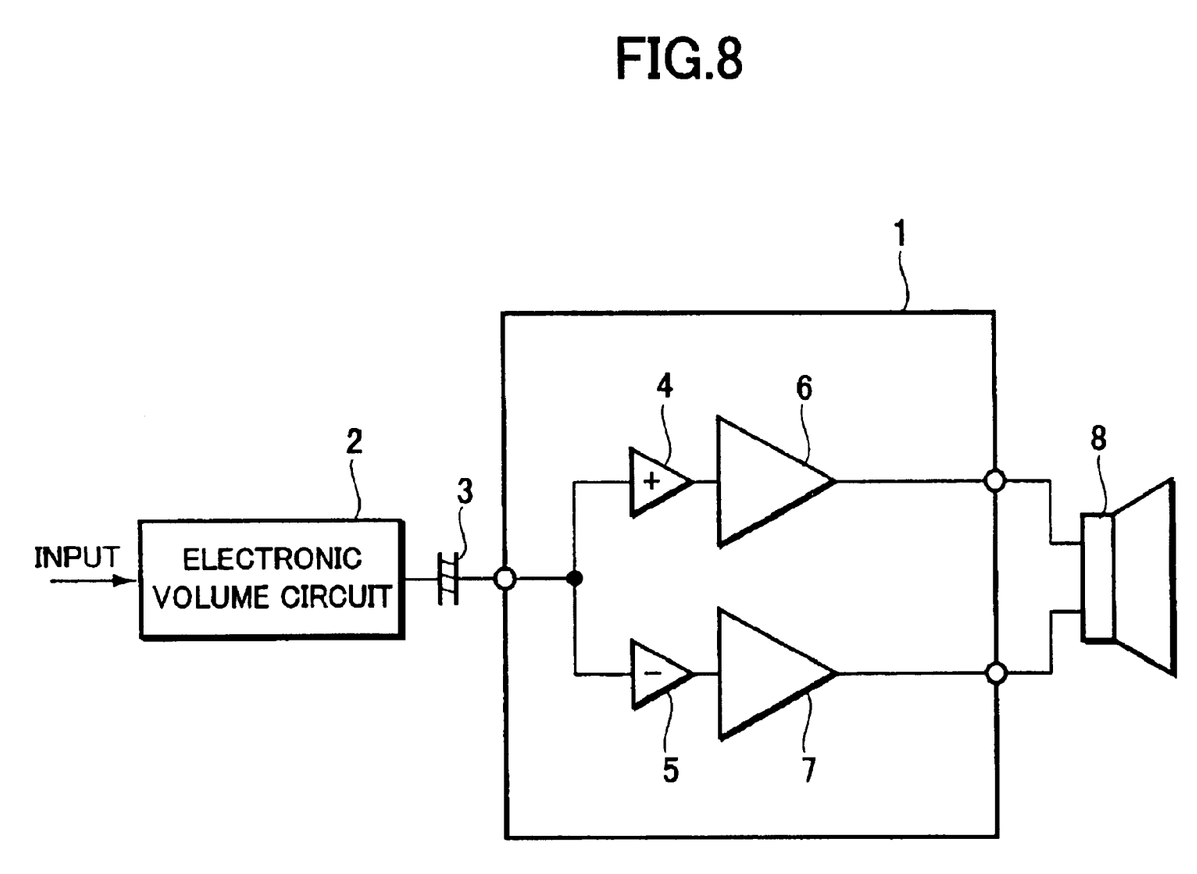
FIG. 8 is a view showing a configuration of a conventional BTL amplifying system.

FIG. 8 is a view showing a conventional BTL amplifying system for driving a speaker, and it shows a case of using a BTL amplifier 1 in the form of an IC (integrated circuit) to serve as a direct-coupled amplifier (also referred to as a DC-coupled amplifier).

The BTL amplifier 1 receives an input audio signal having its amplitude adjusted in an electronic volume circuit 2, such as a variable attenuator, through a coupling capacitor 3, and is provided with a non-inverting amplifying circuit 4 for applying non-inverting amplification to the input audio signal, and an inverting amplifying circuit 5 for applying inverting amplification to the input audio signal. Further, it is provided with a power amplifying circuit 6 of a B class push-pull type for applying power amplification to the audio signal having its voltage amplified in the non-inverting amplifying circuit 4, and another power amplifying circuit 7 of a B class push-pull type for applying power amplification to the audio signal having its voltage amplified in the inverting amplifying circuit 5. A speaker 8 is connected somewhere between the output terminals of the power amplifying circuits 6 and 7.

According to this configuration, the power amplifying circuits 6 and 7 are supplied with phase-inverted audio signals from the non-inverting amplifying circuit 4 and the inverting amplifying circuit 5, respectively. Hence, when the power amplifying circuit 6 supplies a power-amplified audio output current to the speaker 8, the power amplifying circuit 7 operates so as to draw a current from the speaker 8. On the other hand, when the power amplifying circuit 7 supplies a power-amplified audio output current to the speaker 8, the power amplifying circuit 6 operates so as to draw a current from the speaker 8.

Given Vcc as the source voltage of the power amplifying circuits 6 and 7 and RL as the load of the speaker 8, then the maximum output power Pout is approximately $(Vcc)^2/(2 \times RL)$, which is approximately four times of $(Vdd)^2/(8 \times RL)$, that is approximately the maximum output power of a SEPP (Single Ended Push-Pull) amplifier. This makes it possible to form an audio device or the like capable of obtaining a large output on a low source voltage.

Incidentally, because the conventional BTL amplifying system described above is composed of the direct-coupled BTL amplifier 1 in the form of an IC to serve as an integrated circuit device, it is configured in such a manner so as to prevent an input of a DC component superimposed on the input audio signal when the amplitude is adjusted in the electronic volume circuit 2. As a result, only an AC input audio signal is inputted through the coupling capacitor 3.

However, in the event that leakage occurs due to deterioration of the coupling capacitor 3 or the characteristic of the BTL amplifier 1 varies due to the influence of an environment, a DC offset current may be outputted to the speaker 8 from the BTL amplifier 1. This causes a problem that a heat generated when the offset current flows through a voice coil in the speaker 8 damages the speaker 8.

SUMMARY OF THE INVENTION

The present invention was devised in view of the foregoing problems, and therefore, it is an object of the present invention to provide an improved BTL amplifying system capable of preventing an offset from being applied to a load such as a speaker, and thereby forestalling damage to the load.

In order to achieve the above and other objects, a first aspect of the invention provides a BTL amplifying system provided with two power amplifying circuits of a BTL configuration for driving a load, the system comprising: detecting device for detecting a change in output voltages to be supplied to the load from the respective power amplifying circuits; and judging device for judging an occurrence of an offset from the change in the output voltages detected by the detecting device. In particular, the detecting device and the judging device continue detecting and judging operations while the power amplifying circuits are driving the load, and driving of the load by the power amplifying circuits is stopped when the judging device judges the occurrence of an offset.

According to the BTL amplifying system configured as above, the occurrence of an offset is detected and judged while the power amplifying circuits of the BTL configuration are driving the load, and the driving operation is stopped upon detection and judgment of the occurrence of an offset. Hence, even when an offset occurs while the load is driven due to an influence of an environment or due to a deterioration caused by the passing of time in an electronic element incorporated as one of the components, it is possible to forestall offset-induced adverse affects or damage to the load.

A second aspect of the invention is characterized in that the detecting device includes: difference device for calculating a difference between the output voltages to be supplied to the load from the respective power amplifying circuits; and comparing device for comparing the difference calculated by the difference device with a certain threshold, and generating a signal indicating a comparison result of the difference with respect to the certain threshold. In particular, the judging device judges the occurrence of an offset from a characteristic of a change in the signal indicating the comparison result and generated by the comparing device.

According to the BTL amplifying system configured as above, a signal for detecting the occurrence of an offset is found by calculating the difference between the output voltages to be supplied to the load from the respective power amplifying circuits, and the occurrence of an offset is judged based on the characteristic of a change in the signal indicating a comparison result obtained by comparing the difference with the certain threshold.

A third aspect of the invention is characterized in that the detecting device includes comparing device for comparing one of the output voltages to be supplied to the load from the respective power amplifying circuits with a certain threshold, and generating a signal indicating a comparison result of one of the output voltages with respect to the certain threshold. Specifically, the judging device judges the occurrence of an offset from a characteristic of a change in the signal indicating the comparison result and generated by the comparing device.

According to the BTL amplifying system configured as above, one of the output voltages to be supplied to the load from the respective power amplifying circuits is compared with the certain threshold, and the occurrence of an offset is judged from the characteristic of a change in the signal indicating the comparison result of the output voltage with respect to the certain threshold.

A fourth aspect of the invention is characterized in that judging device judges the occurrence of an offset from a voltage value of a smoothed signal obtained through smoothing device for smoothing the signal indicating the comparison result and generated by the comparing device.

According to the BTL amplifying system configured as above, the signal indicating the comparison result and generated by the comparing device is converted to a smoothed signal, and the occurrence of an offset is judged based on the voltage value of the smoothed signal.

A fifth aspect of the invention is characterized in that the judging device judges the occurrence of an offset from an information about a measurement result obtained through measuring device for measuring a change with time in a portion having larger magnitude and a portion having smaller magnitude of the signal indicating the comparison result and generated by the comparing device.

According to the BTL amplifying system configured as above, a characteristic for use in judging the occurrence of an offset is found by measuring a change with time in a portion having larger magnitude and a portion having smaller magnitude of the signal indicating the comparison result and generated by the comparing device.

A sixth aspect of the invention is characterized by further including turn-OFF device for stopping the driving of the load by stopping amplifying operation of the respective power amplifying circuits in response to a judgment of the occurrence of an offset made by the judging device.

A seventh aspect of the invention is characterized by further including turn-OFF device for stopping the driving of the load by inhibiting signal input to the respective power amplifying circuits in response to a judgment of the occurrence of an offset made by the judging device.

According to each of the sixth and seventh aspects of the invention, when an offset occurs, an operation of driving the load is stopped by stopping the amplifying operation of the respective power amplifying circuits or inhibiting a signal to be amplified from being inputted to the respective power amplifying circuits.

An eighth aspect of the invention is characterized by further including device for presenting a warning in response to a judgment of the occurrence of an offset made by the judging device. According to this configuration, it is possible for a user or the like to receive a warning signal indicating that an offset has occurred and driving of the load has been stopped.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

The following description will describe preferred embodiments of the invention with reference to the accompanying drawings.

(First Embodiment)

Figure 1:
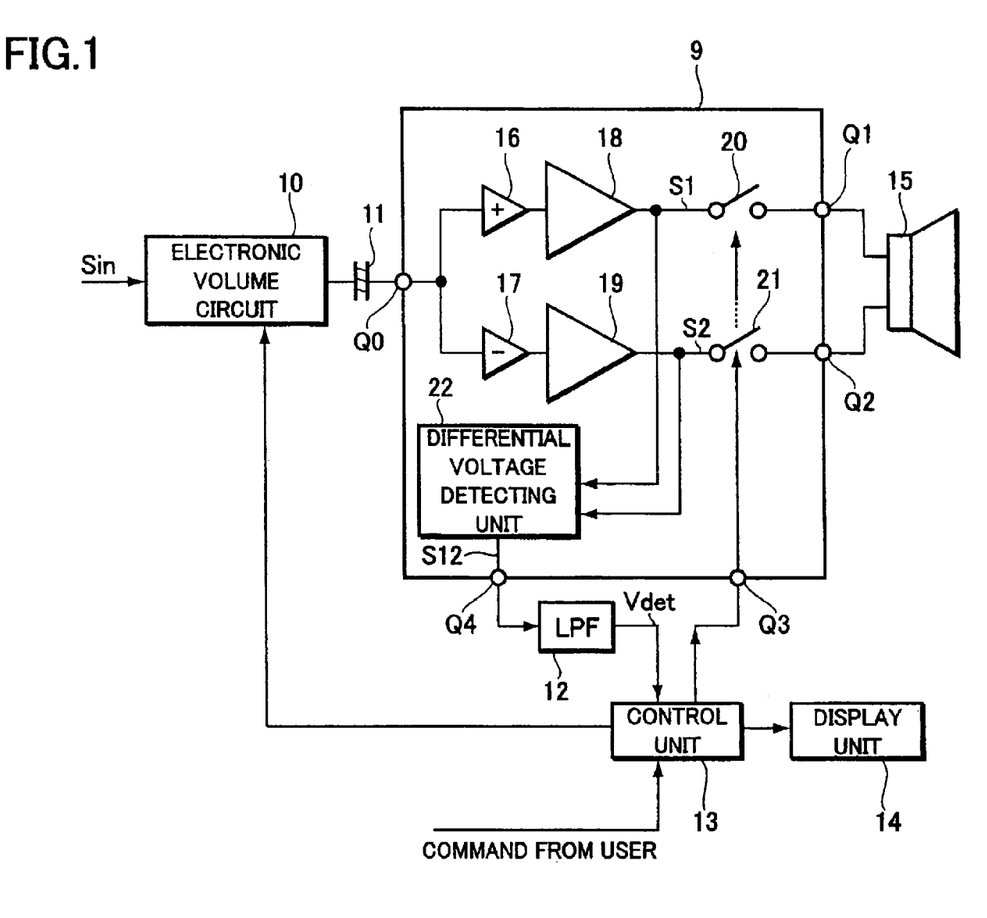
FIG. 1 is a view showing a configuration of a first embodiment of the invention.
Figure 2:
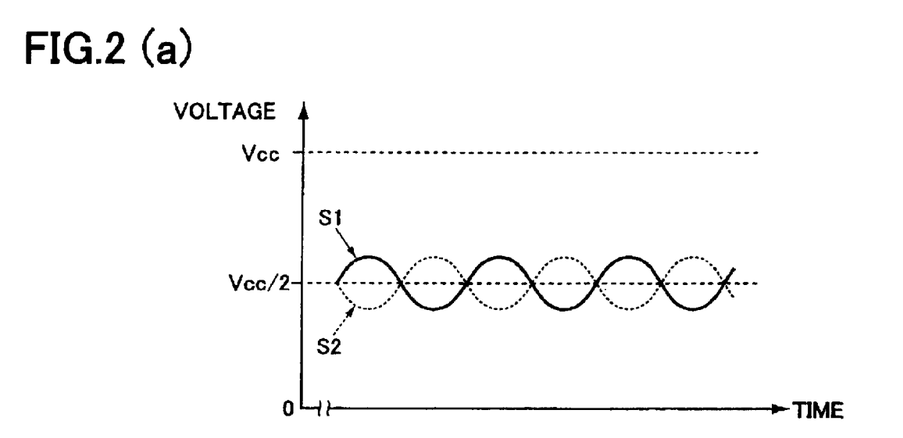
FIGS. 2(a) through 2(d) are waveform charts used to explain the principle in detecting and judging the occurrence of an offset.
Figure 3:
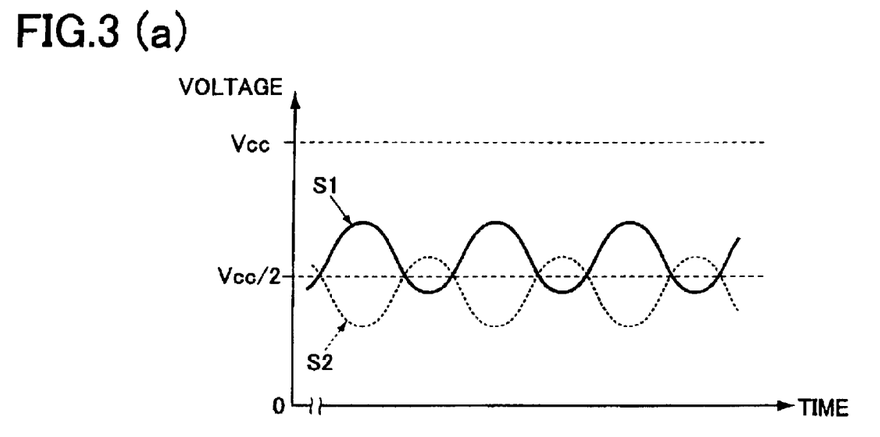
FIGS. 3(a) through 3(d) are waveform charts also used to explain the principle in detecting and judging the occurrence of an offset.

A first embodiment of the invention will be explained with reference to FIGS. 1 through 4. FIG. 1 is a view showing a configuration of a BTL amplifying system of the first embodiment, and it shows an example in which the invention is employed as an amplifying system incorporated in a stereophonic audio device mounted on a vehicle and used to drive speakers provided to their respective stereo channels.

Referring to FIG. 1, the BTL amplifying system of the present embodiment is provided with a BTL amplifier 9 in the form of an IC to serve as an integrated circuit device, an electronic volume circuit 10 for adjusting the amplitude of an input audio signal Sin supplied from a signal source (not shown) and outputting the amplitude-adjusted signal, a coupling capacitor 11, a low-pass filter 12, a control unit 13 equipped with a microprocessor (MPU), and a display unit 14 composed of a liquid crystal display or the like, and is configured to sound a speaker 15 connected somewhere between the output terminals Q1 and Q2 of the BTL amplifier 9 to serve as a load.

The BTL amplifier 9 is provided with a non-inverting amplifying circuit 16 for applying non-inverting amplification to an audio signal supplied at the input terminal Q0 from the electronic volume circuit 10 through the coupling capacitor 11, an inverting amplifying circuit 17 for applying inverting amplification to the audio signal, a power amplifying circuit 18 for applying power amplification to the audio signal having its voltage amplified in the non-inverting amplifying circuit 16, and another power amplifying circuit 19 for applying power amplification to the audio signal having its voltage amplified in the inverting amplifying circuit 17. The amplifying circuits 16 and 17 are set to the same voltage gain, and the amplifying circuits 18 and 19 are set to the same power gain.

Also, these amplifying circuits 16, 17, 18 and 19 can be composed of a generally known direct-coupled amplifying circuit.

It should be noted, however, that the BTL amplifier 9 of the present embodiment is characterized in that the output contacts of the power amplifying circuits 18 and 19 are connected respectively to the output terminals Q1 and Q2 through switch elements 20 and 21 each composed of an analog switch or the like, and that it is provided with a differential voltage detecting unit 22 for generating a differential voltage signal S12 for detecting an offset, using an output voltage S1 from the power amplifying circuit 18 and an output voltage S2 from the power amplifying circuit 19.

The BTL amplifier 9 is also provided with an outside input terminal Q3 for supplying a control signal to the switch elements 20 and 21 from the outside, and an outside output terminal Q4 for outputting the differential voltage signal S12 generated in the differential voltage detecting unit 22. The outside input terminal Q3 is connected to the control unit 13 and the outside output terminal Q4 is connected to the low-pass filter 12.

The differential voltage detecting unit 22 is composed of a differential amplifier (not shown) for calculating the difference between the aforementioned output voltages S1 and S2, and a comparator (not shown) for comparing the voltage level of a difference signal (S1−S2) outputted from the differential amplifier with a certain threshold voltage VTHD.

The threshold voltage VTHD is determined in advance with consideration given to an allowable offset voltage. To be more specific, when an offset voltage generated between the output voltages S1 and S2 is within a range such that does not damage or adversely affect the load, such as the speaker 15, the non-occurrence of a practical offset is assumed from the technical view points, and the occurrence of an offset is assumed when the offset voltage would damage the load, such as the speaker 15. Then, when the non-occurrence of an offset is assumed based on the offset voltage, the offset voltage is judged as being allowable, and a voltage value of the threshold voltage VTHD is determined in advance from experiments or the like with consideration given to the offset voltage judged as being within the allowable range as above.

The aforementioned comparator outputs the differential voltage signal S12 of a rectangular waveform which shifts to a level "L" upon detection of a difference signal (S1−S2) at a level higher than the threshold voltage VTHD and to a level "H" upon detection of a difference signal (S1−S2) at a level equal to or lower than the threshold voltage VTHD.

To be more specific, as shown in FIG. 2(a) by way of example, when there is no offset, the output voltages S1 and S2 respectively from the power amplifying circuits 18 and 19 shape inverted-phase waveforms with reference to an output bias voltage Vcc/2, which is half the source voltage Vcc. Given the output voltages S1 and S2 as the targets for detection by the differential amplifier, then, as shown in FIG. 2(b), the differential amplifier generates a difference signal (S1−S2) whose amplitude varies with reference to a certain reference voltage (a voltage 0 in the drawing).

Since the aforementioned threshold voltage VTHD is set to a voltage shifted by a certain voltage with respect to the certain reference voltage, when the comparator compares the threshold voltage VTHD with the difference signal (S1−S2), it outputs the differential voltage signal S12 of a rectangular waveform as shown in FIG. 2(c). In other words, in a case where there is no offset between the output voltages S1 and S2, when the comparator compares the difference signal (S1−S2) with the threshold voltage VTHD, it outputs the differential voltage signal S12 as shown in FIG. 2(c) which stays in the level "H" in a longer period than a period it stays in the level "L" within one duty period T1 during which inversion between the level "L" and the level "H" occurs.

On the other hand, as shown in FIG. 3(a) by way of example, when there is an offset, the output voltages S1 and S2 respectively from the power amplifying circuits 18 and 19 shape phase-inverted waveforms shifted by an offset voltage with respect to the output bias voltage Vcc/2. Given the output voltages S1 and S2 as the targets of detection by the differential amplifier, then, as shown in FIG. 3(b), the differential amplifier generates a difference signal (S1−S2) whose amplitude is shifted with respect to the aforementioned reference voltage (voltage 0).

Then, the comparator compares the threshold voltage VTHD with the difference signal (S1−S2) and outputs the differential voltage signal S12 of a rectangular waveform as shown in FIG. 3(c). Since the comparator compares the difference signal (S1−S2) whose amplitude varies as being shifted with respect to the reference voltage (voltage 0) with the threshold voltage VTHD, when an offset occurs between the output voltages S1 and S2, the comparator outputs the differential voltage signal S12 which stays in the level "H" in a shorter period in comparison with the differential voltage signal S12 generated when there is no offset as shown in FIG. 2(c).

As has been described, the differential voltage detecting unit 22 detects the difference (S1−S2) between the output voltages S1 and S2 outputted respectively from the power amplifying circuits 18 and 19, and outputs the differential voltage signal S12 in a duty ratio corresponding to the difference (S1−S2).

The low-pass filter 12 is composed of a low-pass filter having a band as high as or lower than the audio band, for example, a low frequency band of 20 Hz or lower, as a pass band, and generates a detection signal Vdet of a DC voltage by smoothing the differential voltage signal S12 outputted from the aforementioned outside output terminal Q4 and supplies the detection signal Vdet to the control unit 13.

To be more specific, upon supply of the differential voltage signal S12 obtained when there is no offset as described with reference to FIGS. 2(a) through 2(c) to the low-pass filter 12, the low-pass filter 12 smoothes the differential voltage signal S12 having the longer level "H" period, and thereby outputs the detection signal Vdet of a DC voltage as shown in FIG. 2(d).

On the other hand, upon supply of the differential voltage signal S12 obtained when there is an offset as described with reference to FIGS. 3(a) through 3(c) to the low-pass filter 12, the low-pass filter 12 smoothens the differential voltage signal S12 having the shorter level "H" period, and thereby outputs the detection signal Vdet of a DC voltage as shown in FIG. 3(d).

Since there is a difference in the voltage levels between the detection signal Vdet shown in FIG. 2(d) and the detection signal Vdet shown in FIG. 3(d), the low-pass filter 12 is configured to output the detection signal Vdet indicating the absence/presence of an offset depending on the difference in the voltage levels.

The control unit 13 is pre-set with a threshold voltage Vok used when making a final judgment as to the absence/presence of an offset. The threshold voltage Vok used for the final judgment is also determined in advance with consideration given to a practically allowable offset voltage.

The control unit 13 compares the voltage level of the detection signal Vdet with the threshold voltage Vok, and judges the absence of an offset in the outputs from the power amplifying circuits 18 and 19 when the voltage level of the detection signal Vdet is higher than the threshold voltage Vok. Conversely, it judges the presence of an offset in the outputs from the power amplifying circuits 18 and 19 when the voltage level of the detection signal Vdet is equal to or lower than the threshold voltage Vok.

Upon judging the presence of an offset, the control unit 13 supplies a switching control signal to the switch elements 20 and 21 through the outside input terminal Q3, and brings the switch elements 20 and 21 into a non-conductive state (OFF state) to cut the connection between the power amplifying circuits 18 and 19 and the speaker 15. Upon judging the absence of an offset, the control unit 13 maintains the conductive state (ON state) of the switch elements 20 and 21. Also, the control unit 13 controls the display unit 14 to display a warning or the like when switching the switch elements 20 and 21 to the non-conductive state.

The control unit 13 performs basic control, for example, it adjusts a volume of the speaker 15 by receiving command information supplied from an operation panel (not shown) or the like manipulated by the user and controlling an operation of the electronic volume circuit 10 at a command from the user. Also, it controls the turn-ON and turn-OFF of the power of the BTL amplifying system in response to the set position of the ignition key of the vehicle, the ON/OFF position of the main power switch, etc. each manipulated by the user.

Figure 4:
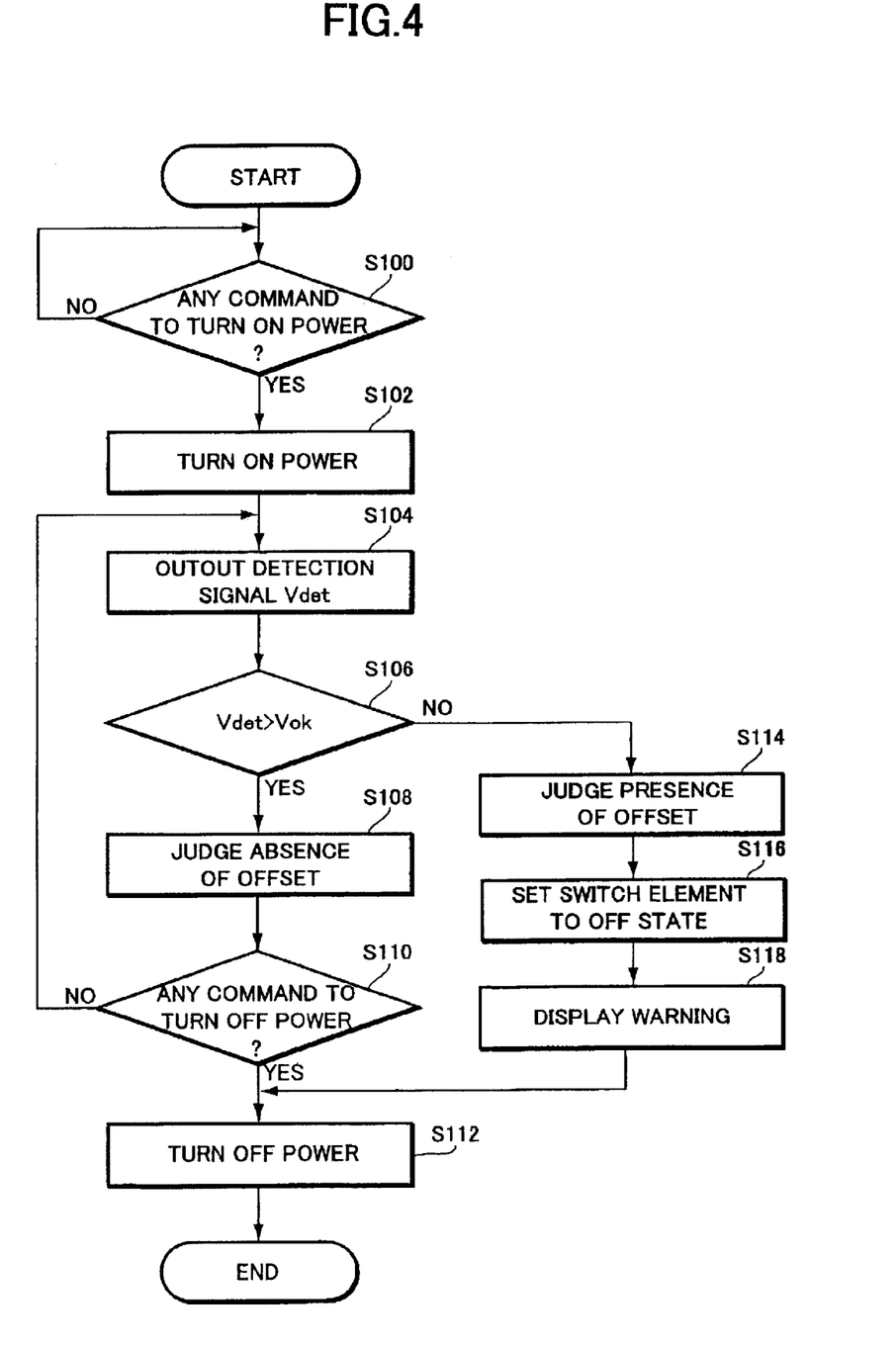
FIG. 4 is a flowchart detailing an operation of the first embodiment.

Next, the following description will describe an operation of the BTL amplifying system configured as above with reference to the flowchart of FIG. 4.

Initially, in Step S100, a command to turn ON the power is made as the user switches ON the main power switch provided to the audio device or the user manipulates and sets the ignition key of the vehicle to the starting position. Then, in Step S102, the control unit 13 turns ON the power of the BTL amplifying system.

Then, an input audio signal Sin played back from a signal source, such as a radio receiver, an MD (Mini Disc) player, a CD (Compact Disc) player, and a DVD (Digital Versatile Disc) player provided to the audio device is supplied to the BTL amplifier 9 through the electronic volume circuit 10 and the coupling capacitor 11. The BTL amplifier 9 thus amplifies the input audio signal Sin and sounds the speaker 15.

In short, once the power is turned ON, the BTL amplifying system starts an amplifying operation as soon as the power is turned ON, and continues to perform Steps S104 through S112 described below along with the amplifying operation.

In subsequent Step S104, when the BTL amplifier 9 starts the amplifying operation, the differential voltage detecting unit 22 calculates the difference (S1−S2) between the output voltages S1 and S2 respectively from the power amplifying circuits 18 and 19, and generates the differential voltage signal S12 by comparing the difference (S1−S2) with the threshold voltage VTHD. The low-pass filter 12 then generates the detection signal Vdet by smoothing the differential voltage signal S12, and outputs the detection signal Vdet to the control unit 13.

In subsequent Step S106, the control unit 13 compares the pre-set threshold voltage Vok with the detection signal Vdet, and judges whether the voltage level of the detection signal Vdet is higher than the threshold voltage Vok. When the voltage level of the detection signal Vdet is higher than the threshold voltage Vok (that is, Vdet>Vok), the flow proceeds to Step S108, where the control unit 13 judges the absence of an offset between the output voltages S1 and S2, and in Step S110, it judges whether the user has inputted a command to turn OFF the power. When there is no command to turn OFF of the power, the flow returns to Step S104 and the processing is repeated. When the user has inputted a command to turn OFF the power source, the control unit 13 stops a supply of power to the BTL amplifying system in Step S112 and ends the series of processing.

On the other hand, when it is judged that the voltage level of the detection signal Vdet is equal to or lower than the threshold voltage Vok (that is, Vdet≦Vok) in Step S106, the flow proceeds to Step S114, where the control unit 13 judges the occurrence of an offset between the output voltages S1 and S2.

In subsequent Step S116, the control unit 13 switches both the switch elements 20 and 21 to the OFF state and thereby cuts the connection between the power amplifying circuits 18 and 19 and the speaker 15. The speaker 15 is thus stopped sounding. Further, in subsequent Step S118, the control unit 13 controls the display unit 14 to display a warning of the occurrence of an abnormality. Then, the control unit 13 forcedly stops a supply of power to the BTL amplifying system in Step S112, and ends the series of processing.

As has been described, the BTL amplifying system of the present embodiment continues to detect the absence/presence of an offset since the instant the power is turned ON, and forcedly turns OFF the power when the offset exceeds an allowable range. Hence, the detection of the absence/presence of an offset is continued while the input audio signal Sin from the sound source is amplified to sound the speaker 15. Consequently, should a DC offset current flow into the speaker 15 while the speaker 15 is sounded continuously as leakage occurs due to deterioration with time of the coupling capacitor 11 or the characteristic of the BTL amplifier 9 varies due to the influence of use environments, an offset being occurred can be detected as soon as possible and the power is turned OFF. This makes it possible to forestall a problem, for example, the speaker 15 is damaged due to heat generated by the offset current.

Also, since a warning is displayed on the display unit 14 when the power is turned OFF, it is possible to present the occurrence of an abnormality to the user.

(Second Embodiment)

Figure 5:
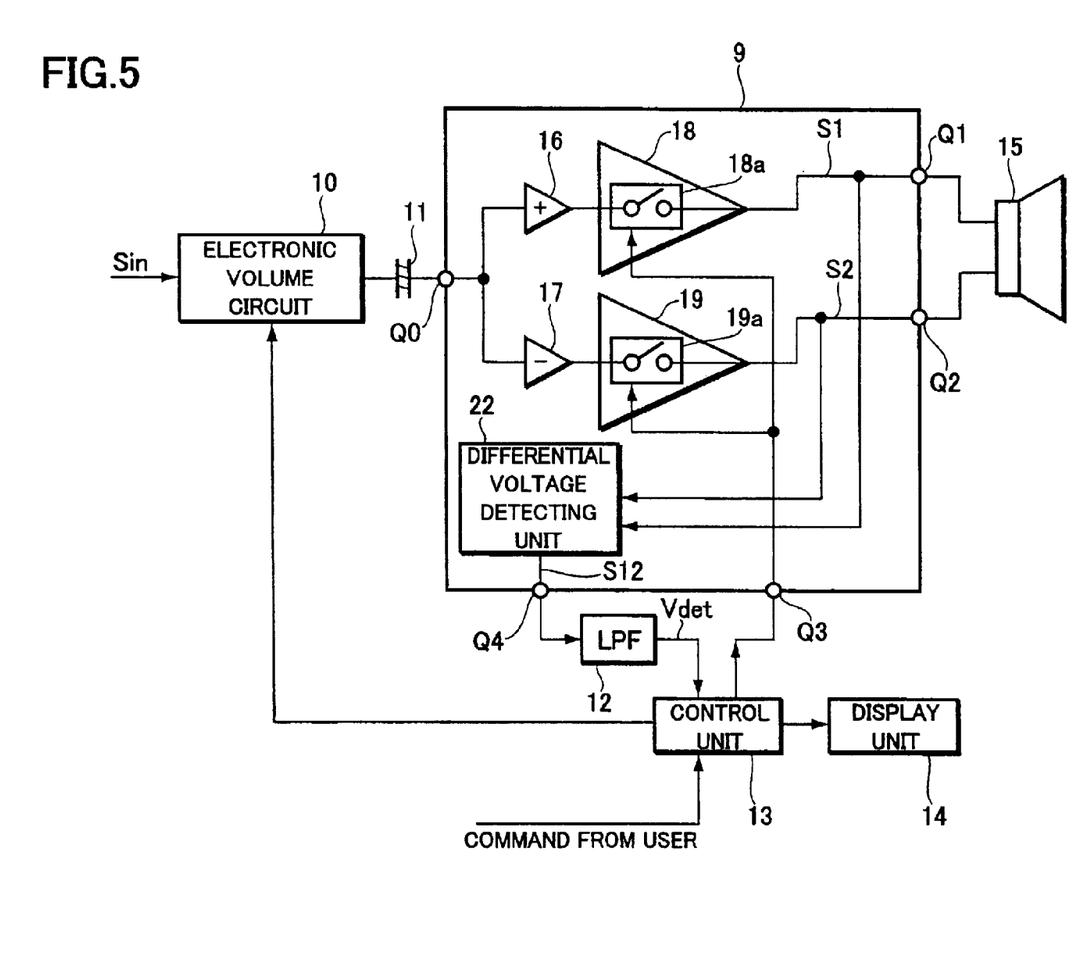
FIG. 5 is a view showing a configuration of a second embodiment of the invention.

Next, the following description will describe a BTL amplifying system of a second embodiment with reference to FIG. 5. FIG. 5 is a view showing a configuration of the BTL amplifying system, and like components with respect to the BTL amplifying system of FIG. 1 are labeled with like reference numerals.

Referring to FIG. 5, the BTL amplifying system of the present embodiment is configured in such a manner that the switch elements 20 and 21 shown in FIG. 1 are omitted, and the output contacts of the power amplifying circuits 18 and 19 are directly connected to the output terminals Q1 and Q2, respectively. Instead, activating/deactivating circuits 18a and 19a are provided respectively to the power amplifying circuits 18 and 19 to allow them to stop their own power amplifying operations.

To be more concrete, an unillustrated constant current source circuit composed of a current mirror circuit or the like is provided to each of the power amplifying circuits 18 and 19, and the output voltages S1 and S2 for driving the speaker 15 are generated by applying power amplification to currents outputted from the constant current source circuits according to the audio signals outputted from the non-inverting amplifying circuit 16 and the inverting amplifying circuit 17, respectively. The activating/deactivating circuits 18a and 19a stop the generation of the output voltages S1 and S2 by interrupting the currents outputted from the aforementioned constant current source circuits.

The BTL amplifying system configured as above continues to perform the same offset detection processing as that in the first embodiment described with reference to FIGS. 2(a) through 2(d) and FIGS. 3 and 4.

To be more specific, the differential voltage detecting unit 22 calculates the difference (S1−S2) between the output voltages S1 and S2 respectively from the power amplifying circuits 18 and 19, and generates the differential voltage signal S12 by comparing the difference (S1–S2) with the threshold voltage VTHD. The low-pass filter 12 then generates the detection signal Vdet by smoothing the differential voltage signal S12 and outputs the detection signal Vdet to the control unit 13.

Further, the control unit 13 judges the occurrence of an offset upon detection of the detection signal Vdet having a level equal to or lower than the threshold voltage Vok, and controls the activating/deactivating circuits 18a and 19a in such a manner that the power amplifying circuits 18 and 19 stop their own power amplifying operations.

Hence, in the BTL amplifying system of the present embodiment, should a DC offset current flow into the speaker 15 while the speaker 15 is sounded continuously as leakage occurs due to deterioration with time of the coupling capacitor 11 or the characteristic of the BTL amplifier 9 varies due to the influence of use environments, an offset being occurred can be detected as soon as possible and the amplifying operation is stopped. This makes it possible to forestall a problem, for example, the speaker 15 is damaged due to heat generated by the offset current.

(Third Embodiment)

Figure 6:
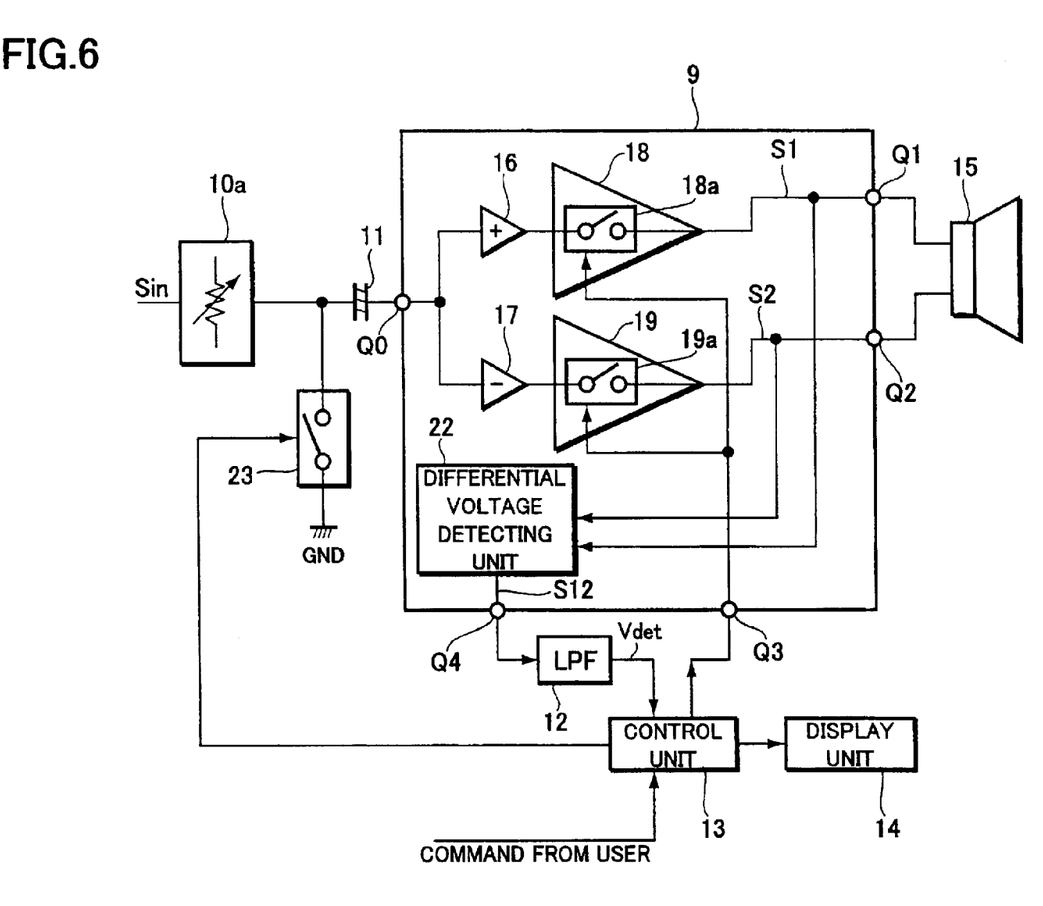
FIG. 6 is a view showing a configuration of a third embodiment of the invention.

Next, the following description will describe a BTL amplifying system of a third embodiment with reference to FIG. 6. FIG. 6 is a view showing a configuration of the BTL amplifying system of the present embodiment, and like components with respect to the BTL amplifying system of FIG. 5 are labeled with like reference numerals.

Referring to FIG. 6, the BTL amplifying system of the present embodiment is provided with a mechanical attenuator 10a instead of the electronic volume circuit 10 to allow the user to variably adjust a quantity of attenuation of the input audio signal Sin by hand, and a switch element 23 is connected somewhere between the output contact of the mechanical attenuator 10a and the ground terminal GND provided to the BTL amplifying system. The control unit 13 controls the ON/OFF operation of the switch element 23.

The BTL amplifying system configured as above continues to perform the same offset detection processing as that in the first embodiment explained with reference to FIGS. 2(a) through 2(d) and FIGS. 3 and 4.

To be more specific, when there is no offset between the output voltages S1 and S2, the control unit 13 sets the switch element 23 to the OFF state. The input audio signal is thus inputted to the BTL amplifier 9 and a normal amplifying operation is performed. During the normal amplifying operation, the differential voltage detecting unit 22 calculates the difference (S1–S2) between the output voltages S1 and S2 respectively from the power amplifying circuits 18 and 19, and generates the differential voltage signal S12 by comparing the difference (S1–S2) with the threshold voltage VTHD. The low-pass filter 12 then generates the detection signal Vdet by smoothing the differential voltage signal S12, and outputs the detection signal Vdet to the control unit 13.

Further, upon detection of the detection signal Vdet having a level equal to or lower than the threshold voltage Vok, the control unit 13 judges the occurrence of an offset, and controls the activating/deactivating circuits 18a and 19a in such a manner that the power amplifying circuits 18 and 19 stop their own power amplifying operations.

Moreover, upon judging the occurrence of an offset, the control unit 13 not only controls the power amplifying circuits 18 and 19 to stop their own power amplifying operations, but also controls the switch element 23 to switch from the OFF state to the ON state, so that the audio signal from the attenuator 10a is muted and thereby prevented from being supplied to the coupling capacitor 11.

As has been described, according to the BTL amplifying system of the present embodiment, an input of the audio signal itself is stopped upon the occurrence of an offset, and therefore, not only can the speaker 15 be protected in a reliable manner, but also the BTL amplifier 9 can be protected.

The electronic amplifying circuits 18 and 19 may be configured in such a manner that they are not provided with the aforementioned activating/deactivating circuits 18a and 19a, and merely control the switch element 23 to be ON when the occurrence of an offset is detected. In short, by inhibiting a supply of the input audio signal to the BTL amplifier 9, it is possible to prevent an offset voltage from being applied to the speaker 15 in advance.

Figure 7:
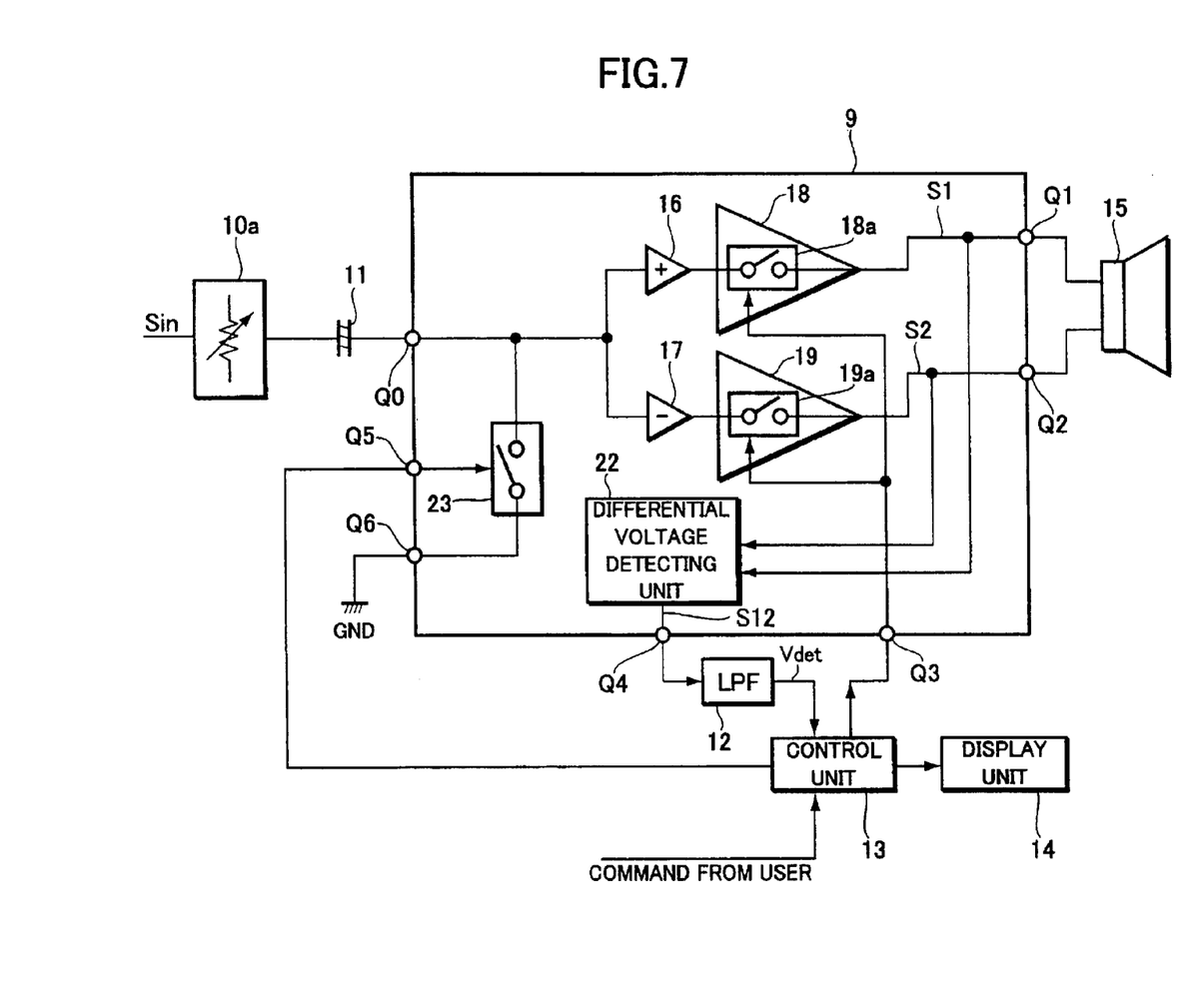
FIG. 7 is a view showing a configuration of a modification of the third embodiment.

The BTL amplifying system of FIG. 6 is configured in such a manner that the switch element 23 is connected to the outside at somewhere between the input side contact of the coupling capacitor 11 and the ground terminal GND. However, the present embodiment may be modified as shown in FIG. 7, in which the switch element 23 composed of an analog switch or the like is pre-formed in the interior of the BTL amplifier 9, and upon judging the occurrence of an offset based on the detection signal Vdet, the control unit 13 controls the switch element 23 to be ON through a control signal input terminal Q5, so that an input of the audio signal to the non-inverting amplifying circuit 16 and to the inverting amplifying circuit 17 is inhibited.

In the case of the above configuration, because the switch element 23 is connected to a ground connection terminal Q6 at one end, when the switch element 23 is controlled to switch to the ON state, the input potential in each of the non-inverting amplifying circuit 16 and the inverting amplifying circuit 17 is set to the ground potential. As a result, the output voltages S1 and S2 necessary to drive the speaker 15 are not outputted from the power amplifying circuits 18 and 19.

The mechanical attenuator 10a and the switch element 23 of the present embodiment may be provided to the BTL amplifying system of the first embodiment shown in FIG. 1.

As has been described, in the first through third embodiments described above, as shown in FIGS. 1, 5, 6, and 7, the detection signal Vdet of a DC voltage is obtained by smoothing the differential voltage signal S12 of a rectangular waveform outputted from the differential voltage detecting unit 22 in the low-pass filter 12. It should be appreciated, however, that the invention is not limited to cases where the detection signal Vdet is obtained in the low-pass filter 12.

To be more specific, the low-pass filter 12 may be replaced with a re-settable timer circuit or counter circuit which is connected somewhere between the terminal Q4 and the control unit 13, so that periods during which the differential voltage signal S12 stays in the level "H" and in the level "L" in one duty period are measured by the timer circuit or the counter circuit, and the result of measurement is supplied to the control unit 13 instead of the detection signal Vdet. Then, the control unit 13 detects a duty ratio of the level "H" period and the level "L" period from the result of measurement, compares the duty ratio with pre-set threshold data used to judge an offset, and makes a final judgment as to the occurrence of an offset.

Alternatively, the aforementioned timer circuit or counter circuit may be pre-formed in the interior of the BTL amplifier 9 together with the differential voltage detecting unit 22, so that data of the result of measurement outputted from the timer circuit or the counter circuit is outputted from the terminal Q4.

Further, in the first through third embodiments, the differential voltage detecting unit 22 is provided so that the difference (S1−S2) between the output voltages S1 and S2 outputted respectively from the power amplifying circuits 18 and 19 is calculated, and the differential voltage signal S12 of a rectangular waveform is generated by comparing the difference (S1−S2) with the threshold voltage VTHD.

It should be appreciated, however, that the invention is not limited to cases where the difference (S1−S2) between the output voltages S1 and S2 is calculated. A signal of the same rectangular waveform as that of the aforementioned differential voltage signal S12 maybe generated by comparing a change in either of the output voltages S1 and S2 with a certain threshold voltage VTHD', so that this signal is smoothed in the low-pass filter 12 or measured by the timer circuit or the counter circuit.

In the case of the configuration as above, when the output voltage S1 is the target of detection, the threshold voltage VTHD' is set to the sum of a voltage Vcc/2, which is half the source voltage Vcc, and a voltage VTHD/2, which is half the aforementioned threshold voltage VTHD, that is, a voltage expressed as (Vcc+VTHD)/2. Then, a signal of a rectangular waveform is generated, which shifts to the level "L" when the output voltage S1 has a level higher than the threshold voltage VTHD', and to the level "H" when the output voltage S1 has a level equal to or lower than the threshold voltage VTHD'. The signal thus generated is outputted instead of the aforementioned differential voltage signal S12.

When the output voltage S2 is the target of detection, the threshold voltage VTHD' is set to the difference between a voltage Vcc/2, which is half the source voltage Vcc, and a voltage VTHD/2, which is half the aforementioned threshold voltage VTHD, that is, a voltage expressed as (Vcc−VTHD)/2. Then, a signal of a rectangular waveform is generated, which shifts to the level "L" when the output voltage S2 has a level equal to or lower than the threshold voltage VTHD', and to the level "H" when the output voltage S2 has a level higher than the threshold voltage VTHD'. The signal thus generated is outputted instead of the aforementioned differential voltage signal S12.

As has been described, it is also possible to detect the absence/presence of an offset using one of the output voltages S1 and S2 as the target of detection.

In the embodiments described above, as explained with reference to the flowchart of FIG. 4, the occurrence of an offset is detected and judged constantly while the speaker 15 is driven. It should be appreciated, however, that the invention is not limited to cases of performing so-called constant detection described as above.

In other words, while the speaker 15 is driven, processing to detect and judge the occurrence of an offset may be repeated at predetermined regular intervals (for example, every second, every 10 seconds, every minute, or every hour), and the driving of the speaker 15 is stopped at the instant the occurrence of an offset is judged.

The predetermined regular interval may differ in a certain time period immediately after the turn-ON of the power of the BTL amplifying system and in the period after this certain period has passed. The important point is that a countermeasure against an offset that best suits the situation can be provided by setting the timing at which the so-called constant detection is performed while the speaker 15 is driven according to practical use.

Alternatively, a command may be issued from the outside while the speaker 15 is driven to detect the occurrence of an offset. In other words, by giving an explanation using the above embodiments as an example, when a detection command signal is inputted into the control unit 13, the control unit 13 may control the differential voltage detecting unit 22 to start to detect the output voltages S1 and S2, so that the control unit 13 judges the occurrence of an offset based on the detection result. According to this configuration, the user or an inspection technical expert can check the operation status of the BTL amplifying system, which offers an advantage that accidents of various kinds can be prevented in advance.

As has been described above, according to the BTL amplifying system of the invention, the occurrence of an offset is detected and judged while the power amplifying circuits of the BTL configuration are driving the load, and the driving operation is stopped upon detection and judgment of the occurrence of an offset. Hence, even when an offset occurs while the load is driven due to the influence of use environments or due to deterioration with time of an electronic element incorporated as one of the components, it is possible to forestall offset-induced adverse affects or damage to the load.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A BTL amplifying system including two power amplifying circuits of a BTL configuration for driving a load, said system comprising:

a detecting device for detecting a change in output voltages to be supplied to said load from said respective power amplifying circuits; and a judging device for judging an occurrence of an offset from the change in said output voltages detected by said detecting device, wherein said detecting device and said judging device continue detecting and judging operations while said power amplifying circuits are driving said load, and driving of said load by said power amplifying circuits is stopped when said judging device judges the occurrence of an offset.

2. The BTL amplifying system according to claim 1, wherein said detecting device includes:

a difference device for calculating a difference between the output voltages to be supplied to said load from said respective power amplifying circuits; and a comparing device for comparing the difference calculated by said difference device with a predetermined threshold, and generating a signal indicating a comparison result of the difference with respect to the predetermined threshold, and said judging device judges the occurrence of an offset from a characteristic of a change in the signal indicating the comparison result and generated by said comparing device.

3. The BTL amplifying system according to claim 1, wherein:

said detecting device includes a comparing device for comparing one of the output voltages to be supplied to said load from said respective power amplifying circuits with a predetermined threshold, and generating a signal indicating a comparison result of one of the output voltages with respect to the predetermined threshold; and said judging device judges the occurrence of an offset from a characteristic of a change in the signal indicating the comparison result and generated by said comparing device.

4. The BTL amplifying system according to claim 1, wherein said judging device judges the occurrence of an offset from a voltage value of a smoothed signal obtained by a smoothing device for smoothing the signal indicating a comparison result and generated by a comparing device.

5. The BTL amplifying system according to claim 2, wherein said judging device judges the occurrence of an offset from a voltage value of a smoothed signal obtained by a smoothing device for smoothing the signal indicating the comparison result and generated by said comparing device.

6. The BTL amplifying system according to claim 3, wherein said judging device judges the occurrence of an offset from a voltage value of a smoothed signal obtained by a smoothing device for smoothing the signal indicating the comparison result and generated by said comparing device.

7. The BTL amplifying system according to claim 1, wherein said judging device judges the occurrence of an offset from an information about a measurement result obtained by a measuring device for measuring a change with time in a portion comprising a larger magnitude and a portion comprising a smaller magnitude of the signal indicating comparison result and generated by a comparing device.

8. The BTL amplifying system according to claim 2, wherein said judging device judges the occurrence of an offset from an information about a measurement result obtained by a measuring device for measuring a change with time in a portion comprising a larger magnitude and a portion comprising a smaller magnitude of the signal indicating the comparison result and generated by said comparing device.

9. The BTL amplifying system according to claim 3, wherein said judging device judges the occurrence of an offset from an information about a measurement result obtained by a measuring device for measuring a change with time in a portion comprising a larger magnitude and a portion comprising a haying smaller magnitude of the signal indicating the comparison result and generated by said comparing device.

10. The BTL amplifying system according to claim 1, further comprising:
a turn-OFF device for stopping the driving of said load by stopping an amplifying operation of said respective power amplifying circuits in response to a judgment of the occurrence of an offset by said judging device.

11. The BTL amplifying system according to claim 2, further comprising:
a turn-OFF device for stopping the driving of said load by stopping an amplifying operation of said respective power amplifying circuits in response to a judgment of the occurrence of an offset made by said judging device.

12. The BTL amplifying system according to claim 3, further comprising:
a turn-OFF device for stopping the driving of said load by stopping an amplifying operation of said respective power amplifying circuits in response to a judgment of the occurrence of an offset by said judging device.

13. The BTL amplifying system according to claim 1, further comprising:
a turn-OFF device for stopping the driving of said load by inhibiting signal input to said respective power amplifying circuits in response to a judgment of the occurrence of an offset by said judging device.

14. The BTL amplifying system according to claim 2, further comprising:
a turn-OFF device for stopping the driving of said load by inhibiting signal input to said respective power amplifying circuits in response to a judgment of the occurrence of an offset made by said judging device.

15. The BTL amplifying system according to claim 3, further comprising:
a turn-OFF device for stopping the driving of said load by inhibiting signal input to said respective power amplifying circuits in response to a judgment of the occurrence of an offset by said judging device.

16. The BTL amplifying system according to claim 1, further comprising:
a device for presenting a warning in response to a judgment of the occurrence of an offset by said judging device.

17. The BTL amplifying system according to claim 2, further comprising:
a device for presenting a warning in response to a judgment of the occurrence of an offset by said judging device.

18. The BTL amplifying system according to claim 3, further comprising:
a device for presenting a warning in response to a judgment of the occurrence of an offset by said judging device.

19. An amplifying system including two power amplifying circuits for driving a load, said system comprising:
means for detecting a change in output voltages to be supplied to said load from said respective power amplifying circuits; and
means for judging an occurrence of an offset from the change in said output voltages detected by said means for detecting,
wherein said means for detecting and said means for judging continue detecting and judging operations while said power amplifying circuits are driving said load, and
wherein said power amplifying circuits stop driving said load when said means for judging judges the occurrence of an offset.

20. An amplifying system including two power amplifying circuits for driving a load, said system comprising:
a detecting device that detects a change in output voltages to be supplied to said load from said respective power amplifying circuits; and
a judging device that judges an occurrence of an offset from the change in said output voltages detected by said detecting device,
wherein said detecting device and said judging device continuously detect and judge when said power amplifying circuits drive said load, and
wherein said power amplifying circuits stop driving said load when said judging device judges the occurrence of the offset.

* * * * *